United States Patent
Hirose

(10) Patent No.: US 7,456,111 B2
(45) Date of Patent: Nov. 25, 2008

(54) PLASMA ETCHING METHOD AND PLASMA ETCHING APPARATUS

(75) Inventor: Hisashi Hirose, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 273 days.

(21) Appl. No.: 11/274,122

(22) Filed: Nov. 16, 2005

(65) Prior Publication Data

US 2006/0102589 A1    May 18, 2006

Related U.S. Application Data

(60) Provisional application No. 60/635,616, filed on Dec. 14, 2004.

(30) Foreign Application Priority Data

Nov. 16, 2004 (JP) ............... 2004-331759

(51) Int. Cl.
*H01L 21/302* (2006.01)
*H01L 21/461* (2006.01)

(52) U.S. Cl. .................. 438/706; 438/710; 438/714
(58) Field of Classification Search ............... 438/706, 438/710, 714
See application file for complete search history.

(56) References Cited

U.S. PATENT DOCUMENTS

| 4,595,453 A * | 6/1986 | Yamazaki et al. ............ 438/718 |
| 4,732,761 A * | 3/1988 | Machida et al. ............. 438/695 |
| 4,865,685 A * | 9/1989 | Palmour ..................... 438/718 |
| 6,617,244 B2 * | 9/2003 | Nishizawa ................... 438/637 |
| 6,919,274 B2 * | 7/2005 | Kazumi et al. ............. 438/687 |
| 7,029,594 B2 * | 4/2006 | Yasui et al. ................... 216/61 |
| 2002/0177322 A1 * | 11/2002 | Li et al. ..................... 438/710 |
| 2004/0082185 A1 | 4/2004 | Yamaguchi ................. 438/709 |

FOREIGN PATENT DOCUMENTS

JP      2004-140025      5/2004

* cited by examiner

*Primary Examiner*—Duy-Vu N Deo
(74) *Attorney, Agent, or Firm*—Oblon, Spivak, McClelland, Maier & Neustadt, P.C.

(57) ABSTRACT

At a surface of a semiconductor wafer W as a processing object, a SiOC layer, a SiC layer and a Cu layer are formed in the order from an upper side. In the SiOC layer, a first opening for forming a via is formed. Using the SiOC layer as a mask, a plasma etching of the SiC layer is selectively carried out by using an etching gas containing a gas mixture of $NF_3$/He/Ar, thereby a second opening continuously following from the first opening being formed. Therefore, it is possible to carry out the etching of the SiC layer with a high selectivity with respect to the SiOC layer.

10 Claims, 3 Drawing Sheets

PLASMA ETCHING METHOD AND PLASMA ETCHING APPARATUS

CROSS-REFERENCE TO RELATED APPLICATION

This application is based upon and claims the benefit of priority from the prior Japanese Patent Application No. 2004-331759, filed on Nov. 16, 2004; and the prior U.S. Patent Provisional Application No. 60/635,616, filed on Dec. 14, 2004; the entire contents of which are incorporated herein by reference.

BACKGROUND OF THE INVENTION

1. Field of the Invention

The present invention relates to a plasma etching method and a plasma etching apparatus for forming a plasma of an etching gas and etching a SiC layer formed on a processing object.

2. Description of the Related Art

Conventionally, a plasma etching method has been widely used in a manufacturing process and the like of a semiconductor device. In the plasma etching method, it has been known to use an etching gas consisting of a mixed gas of $CHF_3$ and $N_2$ for selectively etching a SiC layer formed on a processing object with respect to an oxide layer ($SiO_2$ layer) which constitutes an insulation layer (for example, refer to Japanese Patent Laid-open Application No. 2004-140025).

Recently, in a manufacturing field of the semiconductor device, as an oxide layer constituting an insulation layer, for example, SiOC ((CDO)Carbon-doped oxide) etc. as a so called Low-k film having a lower dielectric constant have been used.

However, when an etching gas consisting of a mixed gas of $CHF_3$ and $N_2$ was used, when etching the SiC layer, it was impossible to obtain a sufficient selectivity to the SiOC layer. Thus, there was a problem that the selection ratio (etching rate of SiC layer/etching rate of SiOC layer) becomes to about less than 2.

SUMMARY OF THE INVENTION

The invention was made to cope with the above problems. An object of the invention is to provide a plasma etching method and a plasma etching apparatus which enable to etch a SiC layer with respect to a SiOC layer with high selectivity.

A first aspect of the present invention is a plasma etching method comprising the steps of forming a plasma of etching gas, and etching a SiC layer formed on a processing object by the plasma, wherein the etching gas contains at least a $NF_3$ gas, a He gas, and an Ar gas.

In the plasma etching method of the invention, the processing object further comprises a SiOC layer formed thereon and the SiC layer is selectively etched with respect to the SiOC layer.

In the plasma etching method of the invention, the SiOC layer is formed on the SiC layer, and the SiC layer is etched by using the SiOC layer as a mask.

In the plasma etching method of the invention, the plasma etching of the processing object is carried out while cooling the processing object to a temperature of 30° C. or less.

In the plasma etching method of the invention, the plasma etching method further comprises the steps of receiving the processing object into a processing chamber, and introducing the etching gas into the processing chamber such that a residence time of the etching gas in the processing chamber is in the range of 0.36 to 1.44 ms.

In the plasma etching method of the invention, the plasma etching method further comprises the steps of receiving the processing object into a processing chamber, and reducing a pressure within the processing chamber to be in a range of 2 to 6 Pa.

In the plasma etching method of the invention, the etching gas further comprises a CF base gas or a CHF base gas such that the ratio of flow rate of the CF base gas or the CHF base gas to the flow rate of the $NF_3$ gas is ½ or less.

In the plasma etching method of the invention, the method further comprises the steps of disposing the processing object on a lower electrode, supplying a first high frequency power having a first frequency to an upper electrode disposed at a position opposite to the lower electrode, and simultaneously applying a second high frequency power having a second frequency which is lower than the first frequency of the first high frequency power to the lower electrode so that the plasma etching is performed.

In the plasma etching method mentioned above, a power density of the first high frequency power applied to the upper electrode is in a range of 0.07 to 0.7 $W/cm^2$.

In the plasma etching method mentioned above, a power density of the second high frequency power applying to the lower electrode is in a range of 0.07 to 0.21 $W/cm^2$.

A second aspect of the present invention is a plasma etching apparatuses. The plasma etching apparatus of the invention is for forming a plasma of an etching gas and etching a SiC layer formed on a processing object by using the plasma, comprising a gas supply source supplying a gas containing at least $NF_3$ gas, a He gas and an Ar gas, as the etching gas.

In the plasma etching apparatus of the invention, the processing object further has a SiCO layer formed thereon, and the plasma etching is carried out to selectively etch a SiC layer with respect to the SiOC layer.

In the plasma etching apparatus mentioned above, the SiOC layer is formed on the SiC layer, and the etching of the SiC layer is carried out by using the SiOC layer as a mask.

In the plasma etching apparatus of the invention, the apparatus further comprises means for cooling the processing object so that the plasma etching can be carried out while cooling the processing object to a temperature of 30° C. or less.

The plasma etching apparatus of the invention further comprises a processing chamber for receiving the processing object, and means for introducing the etching gas into the processing chamber such that a residence time of the etching gas in the processing chamber is to be in a range of 0.36 to 1.44 ms.

The plasma etching apparatus of the invention further comprises means for reducing a pressure in the processing chamber to be in a range 2 to 6 Pa.

The plasma etching apparatus of the invention wherein the gas supply source supplying a gas containing a CF base gas or a CHF base gas as an etching gas in a ratio of the flow rate of the CF base gas or the CHF base gas to the flow rate of the $NF_3$ gas is ½ or less.

In the plasma etching apparatus of the invention, the apparatus further comprises a lower electrode for mounting the processing object, an upper electrode disposed at a position opposite to the lower electrode, a first high frequency power supply supplying a first high frequency power having a first frequency to the upper electrode, and a second high frequency power supply supplying a second high frequency power having a second frequency, which is lower than the first frequency of the first high frequency power, to the lower electrode.

In the plasma etching apparatus of the invention, the first high frequency power supply supplies a power in a range of 0.07 to 0.7 W/cm² to the upper electrode.

In the plasma etching apparatus of the invention, the second high frequency power supply supplies a power in a range of 0.07 to 0.21 W/cm².

DESCRIPTION OF THE EMBODIMENTS

We will describe the detail of the invention based on embodiments with reference to drawings.

Figure 1A:
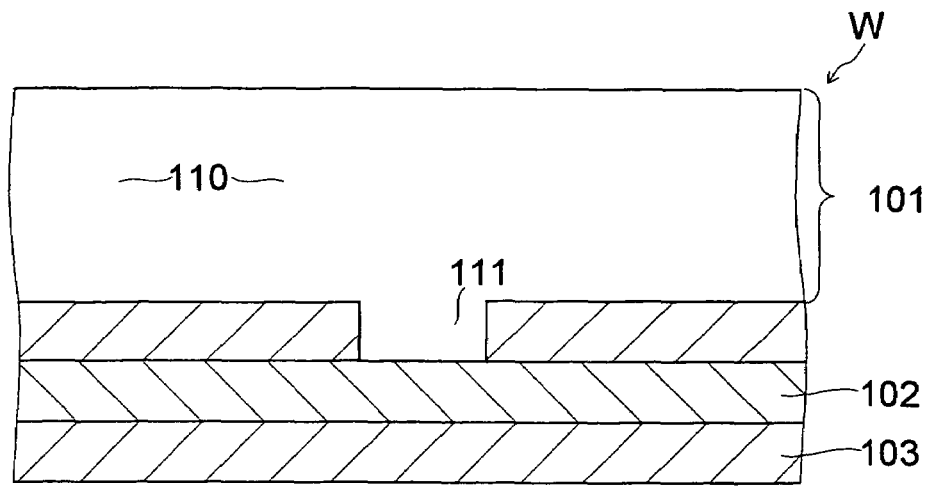
FIG. 1A and FIG. 1B are enlarged drawings showing essential parts of a semiconductor wafer according to one embodiment of the present invention.
Figure 1A:

FIG. 1 shows an enlarged cross-section of a semiconductor wafer of the embodiment of the invention. FIG. 2 shows a structure of a plasma etching apparatus of the embodiment of the invention. First, we will describe the structure of the plasma etching apparatus of the present embodiment with reference to FIG. 2. A plasma etching apparatus 1 is constituted as a capacity coupling type parallel plates etching apparatus to which a power supply for forming a plasma is connected.

The plasma etching apparatus 1 has a chamber (processing chamber) which is formed in a cylindrical shape and is composed of, for example, an aluminum on which yttria is thermal-sprayed, the chamber 2 being grounded. In a bottom portion within the chamber 2, nearly columnar shaped susceptor support 4 for mounting a processing object, for example, a semiconductor wafer thereon is provided through an insulating plate 3 such as a ceramic plate. Further, on the susceptor support 4, a susceptor 5 which constitutes a lower electrode is provided. To the susceptor 5, a high pass filter (HPF) 6 is connected.

Inside the susceptor support 4, a coolant room 7 is provided. In the coolant room 7, a coolant is introduced through a coolant introduction tube 8 and is circulated. And cold heat is transferred to the semiconductor wafer W through the susceptor 5, thereby the temperature of the semiconductor wafer W being controlled to the desired temperature.

The susceptor 5 is formed in a disk shape whose upper side surface provides a projection having a flat top surface at the center portion. And on the projection, an electrostatic chuck 11 having a shape similar to the semiconductor wafer W is provided. The electrostatic chuck 11 is constituted by disposing an electrode 12 between insulation materials. And, by applying a direct current such as 1.5 kV from a direct current power supply 13 connected to the electrode 12, the semiconductor wafer W is electrostatically adsorbed, for example, due to a coulomb force.

In an insulation plate 3, the susceptor support 4, and the susceptor 5, and the electrostatic chuck 11, a gas passage 14 for supplying a heat transfer medium (for example, a He gas etc.) to a rear surface of the semiconductor wafer W is formed. Thus, the cold heat of the susceptor 5 is transferred to the semiconductor wafer W, thereby the semiconductor wafer W being maintained in the predetermined temperature.

At an upper peripheral portion of the susceptor 5, a ring shaped focus ring 15 is disposed such that the semiconductor wafer W is surrounded with the ring 15. The focus ring 15 is formed of, for example, a conductive material such as silicon, and then has an effect to improve the uniformity of etching.

Above the susceptor 5, an upper electrode 21 is disposed opposite to the susceptor 5 and to be parallel to the susceptor 5. The upper electrode 21 is supported at the upper part of the chamber 2 by a insulating member 22, constitutes a plane opposite to the susceptor 5 and has many gas holes 23. For example, the upper electrode 21 is constituted of an electrode plate 24 formed of an aluminum plate having a surface subjected to an anodic oxidation (alumite coating treatment) and providing with a quartz cover, and an electrode supporting member 25 formed of a conductive material and supporting the electrode plate 24. The susceptor 5 and the upper electrode 21 are constituted so as to be changeable a distance therebetween.

At the center portion of the electrode supporting member 25 in the upper electrode 21, a gas inlet 26 is provided, and a gas supplying tube 27 is connected to the gas inlet 26. Further, to the gas supplying tube 27, a processing gas supplying source 30 is connected through a valve 28 and a mass-flow controller 29. An etching gas for plasma etching is supplied from the processing gas supply source 30. In the present embodiment, from the processing gas supply source 30, a gas containing at least NF3, He and Ar is supplied.

At the bottom portion of the chamber 2, an exhaust pipe 31 is connected, and an exhausting device 35 is connected to the exhaust pipe 31. The exhausting device 35 has a vacuum pump such as a turbo molecular pump and is constituted such that an atmosphere within the chamber 2 can be evacuated to a predetermined reduced pressure, for example, to a pressure of 1 Pa or less. Further, at the side wall of the chamber 2, a gate bulb 32 is equipped. And in an open state of the gate bulb 32, the semiconductor wafer W can be conveyed between the chamber 2 and an adjacent load-lock room (not shown).

To the upper electrode 21, a first high frequency power supply 40 is connected, and a matching device 41 is inserted in a power supplying line. Further, in the upper electrode 21, a low pass filter (LPF) 42 is connected. The first high frequency power supply 40 has a frequency in range of 50 to 150 MHz. By applying such high frequency, it is possible to form a plasma which is in a desirable dissociation state and has a high density. The frequency of the first high frequency power supply 40 is preferably in a range of 50 to 80 MHz, and typically, as shown in FIG. 2, the condition of 60 MHz or in the neighborhood of 60 MHz is used.

To the susceptor 5 as a lower electrode, a second high frequency power supply 50 is connected, and a matching device 51 is inserted in a power supplying line. The second high frequency power supply 50 has a frequency range lower than the frequency range of the first high frequency power supply 40. By applying a frequency having such frequency range, it is possible to give proper ionic acts on the semiconductor wafer W which is a processing object without damage to the semiconductor wafer W. The frequency of the second high frequency power supply 50 is preferably in a range of 1 to 20 MHz, and typically, as shown in FIG. 2, the condition of 13.56 MHz or in the neighborhood of 13.56 MHz is used.

In the plasma etching apparatus 1 having a structure mentioned above, the operation thereof is wholly controlled by a control section 60. In the control section 60, a recording medium in which a program showing an order of control is recorded is possessed, and the control section controls the following etching processing operation corresponding to a program which is read out from the recording medium.

Below, we will describe concerning the case of etching a SiC layer formed on the semiconductor wafer W using the plasma etching apparatus 1 having the above structure.

First, after opening the gate bulb 32, a semiconductor wafer W is carried into the chamber 2 from the load lock room (not shown), and is disposed on the electrostatic chuck 11. Then, by applying a high voltage direct current from the high voltage direct current power supply 13, the semiconductor wafer W is statically adsorbed on the electrostatic chuck 11. Next, after closing the gate bulb 32, an inside of the chamber 2 is vacuumed to a predetermined vacuum degree.

After then, by opening the bulb 28, an etching gas, for example, a mixture gas of $NF_3$/He/Ar, is introduced into a hollow section of the upper electrode 21 through the processing gas supplying tube 27 and the gas inlet 26, while controlling a flow rate thereof by the mass flow controller 29, and further, through the gas holes 23 of the electrode plate 24, is discharged uniformly to the semiconductor wafer W.

And, a pressure in the chamber 2 is held to a predetermined pressure. Thereafter, from the first high frequency power supply 40, a high frequency power having a predetermined frequency is applied to the upper electrode 21. Thereby, between the upper electrode 21 and the susceptor 5 as the lower electrode, a high frequency electric field is produced so that the etching gas is dissociated to form a plasma.

On the other hand, from the second high frequency power supply 50, the high frequency power having the frequency lower than the frequency of the first high frequency power supply 40 is applied to the susceptor 5 of the lower electrode. Thereby, ions in the plasma are drawn to the susceptor 5 side, then the anisotropy of etching being enhanced due to the ion assist.

Finally, after the predetermined etching process is finished, the supply of the high frequency power and the supply of the etching gas are stopped, and the semiconductor wafer W is taken out from the chamber 2 with the reverse order to the above-mentioned order.

Next, with reference to FIG. 1, we will describe a plasma etching method of an embodiment of the invention. As shown in FIG. 1A, on a surface of a semiconductor wafer as a processing object, a SiOC layer 101 is formed. And under the SiOC layer 101, a SiC layer 102 is formed, and under the SiC layer 102 a Cu wiring layer 103 is formed.

Further, in the SiOC layer 101, a trench 110 which is depressed linearly along the right and left direction in FIG. 1 is formed. In a bottom of the trench 110, an opening 111 for forming a via is formed. The opening 111 is formed by plasma etching using a mixture gas comprising a CF base gas, Ar gas and $O_2$ gas and using a mask, for example, a resist, and thereafter, by removing the resist by ashing using an $O_2$ gas so as to form having a state as shown in FIG. 1A.

Figure 1B:
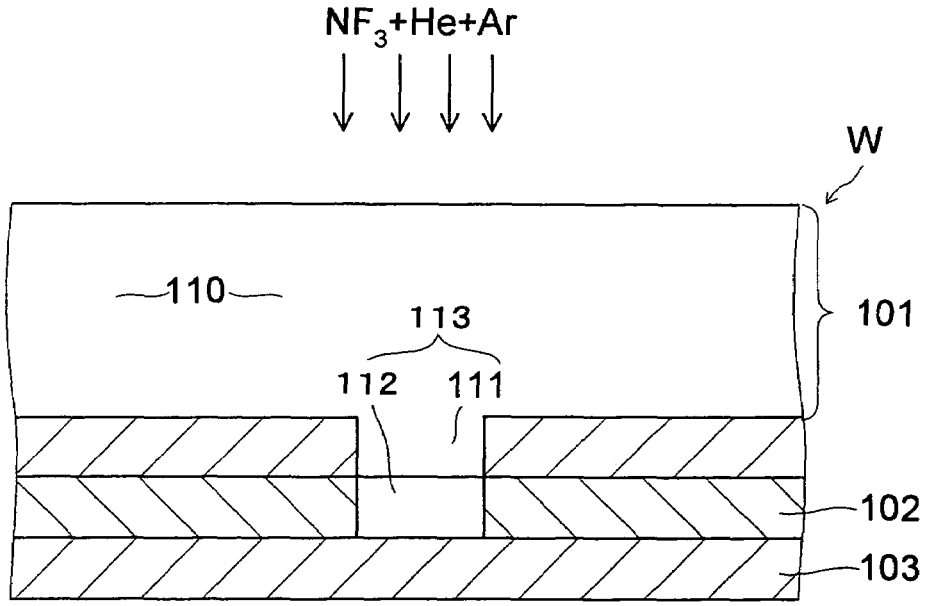
Figure 2:
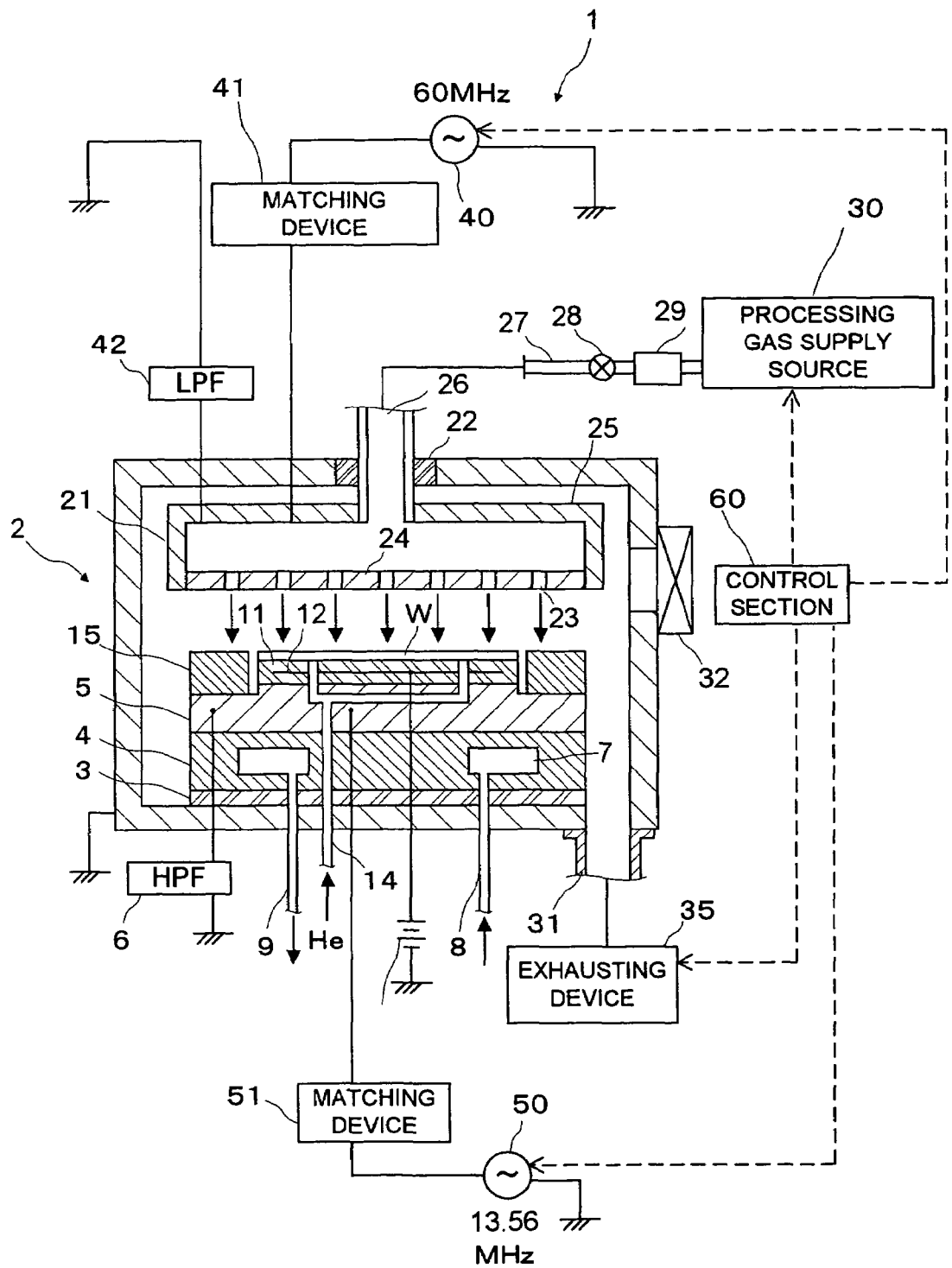
FIG. 2 is a block schematic diagram of a plasma etching apparatus using in one embodiment of the invention.

Further, from the state shown in FIG. 1A, to the state as shown in FIG. 1B, plasma etching of the SiC layer 102 is carried out using a mask of the SiOC layer 101 and using an etching gas of a mixture gas of $NF_3$/He/Ar, to form a second opening 112 following to the opening 111, and finally a via 113 which follows to the Cu wiring layer 103 is formed.

At this time, by using an etching gas containing at least $NF_3$, He and Ar, the selectivity of etching of the SiC layer 102 with respect to the SiOC layer 101 is enhanced.

In Example 1, plasma etching was carried out according to the following etching conditions: gas flow rate: $NF_3$/He/Ar=4/240/200 sccm, pressure: 6 Pa (45 mTorr), power: (upper electrode/lower electrode)=400/150 W, temperature: (upper portion/side wall portion/lower portion)=80/60/0° C., pressure of He for cooling: (central portion/peripheral portion)=1330/1330 Pa (10/10 Torr), distance between electrodes=170 mm. As the result, the etching rate of SiC was 148 nm/min, and the etching rate of SiOC was 9.0 nm/min. Accordingly, the selection ratio was 16.4.

Next, we will describe the investigation results of usable conditions other than the above-mentioned etching conditions. In the above etching conditions, since the pressure is 6 Pa (45 mTorr), the total flow rate of etching gas is 444 sccm, and the volume of chamber 2 is 90 l, the residence time is 0.72 ms.

When a total flow rate is a half (222 sccm), that is, $NF_3$/He/Ar=2/120/100 sccm, a residence time is 1.44 ms. Using this flow rate of etching gas, and regarding other conditions using the same etching conditions as etching conditions of example 1, the etching was carried out. As the results, the etching rate of SiC was 108 nm/min, and the etching rate of SiOC was 8.9 nm/min, thereby the selection ratio being 12.1.

Further, when a total rate is twice (888 sccm), that is, $NF_3$/He/Ar=8/480/400 sccm, a residence time is 0.36 ms. In this case, the etching rate of SiC was 132 nm/min, the etching rate of SiOC was 30.0 nm/min, and the selection ratio was 4.40.

As mentioned above, when the total flow rate was increased and the residence time was decreased, it was observed that the etching rate of SiOC was increased and the selection ratio was reduced. Also, when the total flow was decreased and the residence time was increased, it was observed that the etching rate of SiC was reduced. Owing to the above results, it is desirable that the residence time is about in a range of 0.72 to 1.44 ms, and further at least in a range of 0.36 to 1.44 ms.

Next, we will describe regarding the ratio of the flow rate of etching gas. When an etching gas $NF_3$/He/Ar=4/240/50 sccm in which the flow rate of Ar in example 1 was decreased was supplied, and when an etching gas $NF_3$/He/Ar=4/480/50 sccm in which the flow rate of He was further increased, it was found that a selection ration nearly equal to that of example 1 could be obtained. Therefore, such range of flow rate was a usable range.

On the other hand, when the flow rate of Ar is 0, that is, $NF_3$/He/Ar=6/120/0 sccm was used, the etching rate of SiC was 82 nm/min. and the etching rate of SiOC was 62 nm/min. Thus the selection ratio was 1.32. Therefore, it was found that the addition of Ar is essential to secure the necessary selection ratio.

Regarding the pressure, it was found that when a pressure was 2 Pa (15 mTorr), the selection ratio nearly equal to that of example 1 was obtained. Therefore, a pressure at least in a range of 2 to 6 Pa can be used.

Further, regarding the electric power applied to the upper electrode 21, it was found that when a power of 50 W and a power of 500 W were applied respectively, respective selection ratios thereof nearly equal to that of example 1 (400 W) could be obtained. From the above results, it was found that at least the range of 50 to 500 W could be usable as a power applied to the upper electrode. In this case, since a diameter of the semiconductor wafer W is 300 mm, an allowable range is in a range of 0.07 to 0.7 $W/cm^2$ in terms of power density.

On the other hand, regarding the electric power applied to the low electrode (susceptor 5), it was found that when 50 W and 100 W were applied to the low electrode respectively, selection ratios nearly equal to that of example 1 (150 W) could be obtained, respectively. Accordingly, the power at least in a range of 50 W to 150 W can be used as the power applied to the low electrode (susceptor 5). In this case, since a diameter of the semiconductor wafer W is 300 mm, an allowable range is in a range of 0.07 to 0.21 $W/cm^2$ in terms of power density.

Figure 3:
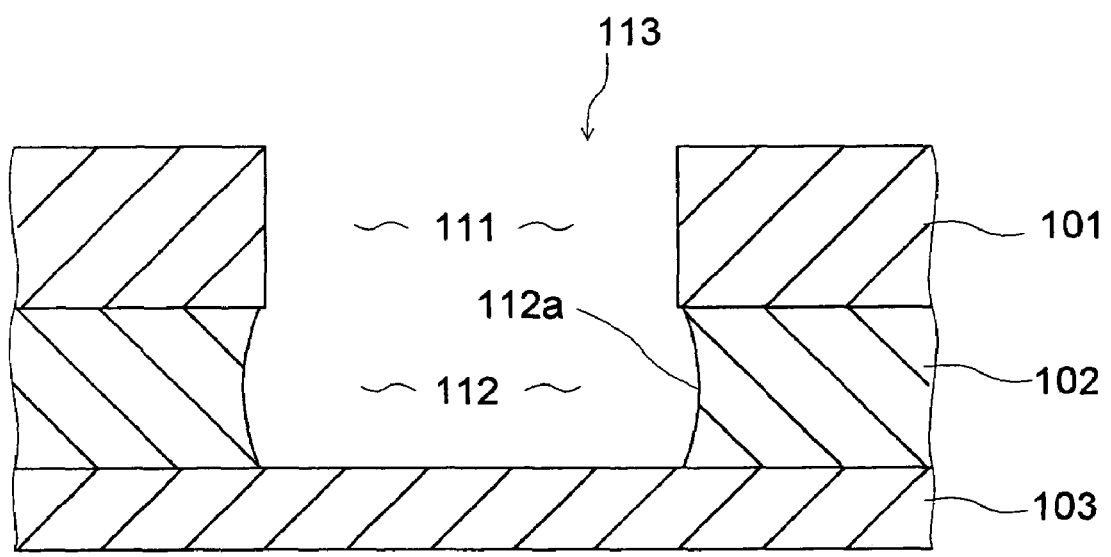
FIG. 3 is a drawing for explaining a shape of a side wall portion of an opening.

Next, we will describe regarding an effect of a temperature at lower portion (temperature of susceptor 5) to a state of etching. As the temperature of lower portion (temperature of susceptor 5), 70° C. and 30° C. were used. In both cases, it was found that selection ratios nearly equal to that in the case of 0° C. of example 1 could be obtained, respectively. However, as shown in FIG. 3, in case of 70° C., the shape of side wall portion 112a in the opening 112 of the SiC layer 102 did not show a straight line, but showed a curved shape towards the outside. As the above, when the shape of inside wall portion of via 113 has a curved shape towards the outside, problems such as the occurrence of voids would be happened when a conductor such as Cu is buried therein.

Regarding the degree of curve in the shape of the above sidewall portion 112a, the degree in the case of 30° C. was decreased than the degree in the case of 70° C., and the degree in the case of 0° C. was decreased than the degree in the case of 30° C. As mentioned above, when a temperature of lower portion (temperature of susceptor 5) is higher, the shape of the side wall portion 112a of the opening 112 has a tendency to be curved. Thus, by decreasing a temperature, the tendency to be curved can be decreased. Therefore, in order to make straight the shape of inside wall portion of the via 113, it is desirable to decrease a temperature of the lower portion (temperature of susceptor 5) to 30° C. or less, more preferably to 0° C. or less.

Further, in order to make straight the shape of the inside wall portion of the above via 113, it is desirable to add a CHF base gas or a CF base gas, for example, $CH_2F_2$ and the like to the above etching gas. Actually, using an etching gas of $NF_3$/He/Ar/$CH_2F_2$=4/240/200/2 sccm, an etching was carried out with the same conditions as those of example 1 regarding the other conditions. As the result, a via 113 having a straight line shaped side wall portion 112a could be obtained. However, in this case, the etching rate of SiC was 124 nm/min. the etching rate of SiOC was 54.9 nm/min, and the selection ratio was 2.26.

As mentioned above, when $CH_2F_2$ and the like is added to an etching gas, the shape of the side wall portion 112a can be formed to be a straight line, but the etching rate of SiOC is increased, and the selection ratio is decreased. For example, when the adding amount of the above $CH_2F_2$ was increased from 2 sccm to 4 sccm, and the flow rate of $CH_2F_2$ is the same flow rate as that of $NF_3$, the selection ratio was 1.90 which is less than 2. Therefore, it is preferable that the flow rate of CHF base gas or CF base gas is ½ or less of the flow rate of $NF_3$ gas.

What is claimed is:

1. A plasma etching method, comprising the steps of:
   forming a plasma of an etching gas; and
   etching a SiC layer formed on a processing object by the plasma,
   wherein the etching gas essentially consisting of a $NF_3$ gas, a He gas and an Ar gas,
   wherein the processing object has a SiOC layer, and the SiC layer is selectively etched with respect to the SiOC layer.

2. The plasma etching method according to claim 1, wherein the SiOC layer is formed on the SiC layer, and the SiC layer is etched by using the SiOC layer as a mask.

3. The plasma etching method according to claim 1, wherein the plasma etching is carried out while cooling the processing object to a temperature of 30° C. or less.

4. The plasma etching method according to claim 1, wherein the method, further comprising:
   receiving the processing object into a processing chamber; and
   introducing the etching gas into the processing chamber such that a residence time of the etching gas is in a range of 0.36 to 1.44 ms.

5. The plasma etching method according to claim 1, wherein the method, further comprising:
   receiving the processing object into a processing chamber; and
   reducing a pressure within the processing chamber to be in a range of 2 Pa to 6 Pa.

6. The plasma etching method according to claim 1, wherein the etching gas contains a CF base gas or a CHF base gas such that a ratio of a flow rate of the CF base gas or the CHF base gas to the flow rate of the $NF_3$ gas is ½ or less.

7. The plasma etching method according to claim 1, the method, further comprising:
   disposing the processing object on a lower electrode; supplying a first high frequency power having a first frequency to an upper electrode disposed at a position opposed to the lower electrode; and
   simultaneously applying a second high frequency power having a frequency lower than the frequency of the first high frequency power to the lower electrode to carry out the plasma etching.

8. The plasma etching method according to claim 7, wherein a power density of the first high frequency power applied to the upper electrode is in a range of 0.07 to 0.7 W/cm$^2$.

9. The plasma etching method according to claim 7, wherein a power density of the second high frequency power applied to the lower electrode is in a range of 0.07 to 0.21 W/cm$^2$.

10. A plasma etching method, comprising the steps of:
    forming a plasma of an etching gas; and
    etching a SiC layer formed on a processing object by the plasma,
    wherein the etching gas essentially consisting of $NF_3$ gas, a He gas, an Ar gas, and also a CF base gas or a CHF base gas, and
    wherein the processing object has a SiOC layer, and the SiC layer is selectively etched with respect to the SiOC layer.

* * * * *